US005784475A

United States Patent [19]

Huang et al.

[11] Patent Number: 5,784,475

[45] Date of Patent: Jul. 21, 1998

[54] STABLE SOUND SYNTHESIZING CIRCUIT

[75] Inventors: Chi-Mao Huang, Dou-Liu; Yu-chih Lin, Taipei; Tsung-min Chen, Hsin-Chu, all of Taiwan

[73] Assignee: United Microelectronics Corporation, Hsin-Chu, Taiwan

[21] Appl. No.: 342,552

[22] Filed: Nov. 21, 1994

[51] Int. Cl.[6] .......... H03G 3/00

[52] U.S. Cl. .......... 381/104; 381/119

[58] Field of Search .......... 381/17, 21, 23, 381/5, 61, 107, 103, 119, 104; 323/222, 313, 315; 365/226

[56] References Cited

U.S. PATENT DOCUMENTS 4,634,956 1/1987 Davis .......... 323/222

5,268,871 12/1993 Dhong .......... 365/226

*Primary Examiner*—Minsun Oh Harvey

*Attorney, Agent, or Firm*—Barnes, Kisselle, Raisch, Choate, Whittemore & Hulbert, P.C.

[57] ABSTRACT

A digital/analog sound synthesizing circuit comprises an RC oscillator outputting a system basic frequency, a timing generator converting the basic frequency into timing signals, a sound synthesizer producing sound numerical code data, and a digital/analog converter outputting an analog signal to drive a speaker. A voltage stabilizing circuit controls the RC oscillator and the digital/analog converter to eliminate sound frequency and volume instability.

4 Claims, 3 Drawing Sheets

STABLE SOUND SYNTHESIZING CIRCUIT

FIELD OF THE INVENTION

The present invention generally relates to a digital/analog sound synthesizing circuits and more particularly, relates to such digital/analog sound synthesizing circuit that utilizes a stable voltage generator for producing a stabilized reference voltage source for controlling a RC oscillator and the output of a digital/analog circuit such that the volume and the quality of the sound produced is not affected by changes in the voltage supply source.

BACKGROUND OF THE INVENTION

In digital/analog sound synthesizing circuits which are run by a VCC voltage between 2.4 V and 5.5 V, the voltage source is sent directly to the sound synthesizer. This leads to a drawback that when the voltage source deteriorates after prolonged usage, the oscillating frequency and the digital/analog output changes accordingly such that the volume and the quality of the sound produced is affected. For instance, in a battery powered voice/melody toy, after the batteries have been in service for a period of time, the voice/melody of toy plays at a slower than normal speed which leads to a loss in sound quality and in sound volume.

As illustrated in a prior art systems in FIGS. 1 and 2, a circuit 10 utilizing a speaker driven digital/analog output and a circuit 20 utilizing a speaker driven digital/analog output are shown, respectively. In these circuits, a suitable preset RC value in an oscillator 12 can first be used to obtain the desirable oscillating frequency signals. The frequency signals are sent to a timing generator 14 in order to produce timing signals (or clock signals) necessary for the circuit to produce a synthesized sound. A sound synthesizer 16 for either words or melody controlled by a suitable timing and control signal, sends numerical sound data to a digital/analog converter 20. The numerical sound data is then converted to analog voltage signals and then sent through a transistor to amplify the signals in order to drive a speaker to produce the desirable sound.

The circuits shown in FIGS. 1 and 2 differ only in using different type of the output transistor. It is n-p-n type transistor 21 in FIG. 1 and p-n-p type transistor 22 in FIG. 2.

In a consumer product, the working voltage range normally falls in between 2.4 to 5.5 volts. This voltage range is frequently supplied by the use of two or three batteries rated at 1.5 V each. The conditions of the battery and the discharge state of the battery therefore produce variations in the voltage level supplied by the battery. The variation in the working voltage in turn produces an instability of the frequency (or speed) of the sound synthesized, or an unstable volume level.

The cause of the instability in the sound frequency and in the sound volume can be analyzed as follows. In a RC oscillator, the oscillating frequency is determined by the charge/discharge time of the RC circuit. The charging of a PC circuit is indicated by the equation $$V(t)=V_O\,(1-e^{-t/RC}),$$

while the discharging of the RC circuit is indicated by $$V(t)=V_O e^{-t/RC},$$

In the equations, V(t) indicates the voltage value at time t, $V_O$ indicates the input voltage value.

The frequency produced is a function of V(t), $V_O$ and RC; or a function of V(t) and $V_O$ for a fixed RC value.

It is known that V(t) is also dependent on the threshold point of the logic gate of the kind that generally makes up a RC oscillator, i.e., NAND, NOR, or INV. If the processing parameters and the aspect ratio can be excluded, the threshold point of the logic gate is then related to the value of $V_O$. The aspect ratio is defined as the ratio of width to length for PMOS/NMOS in the logic gate. From the above, it can therefore be determined that once a device is designed, the most influential parameter on the oscillating frequency of the RC oscillator is the magnitude of the working voltage value.

In FIGS. 3 and 4, the digital/analog conversion circuit 10 (FIG. 3) comprises four PMOS transistors $\mathbf{28}_{1-4}$ fed through contacts $\mathbf{30}_{1-4}$, respectively, whereas circuit 32 in FIG. 4 comprises four NMOS transistors $\mathbf{34}_{1-4}$ fed through contacts $\mathbf{36}_{1-4}$, respectively. The status of contacts 30 or 36 depends on the composition of the specific digital word represented by four bits. The successively incoming words are to be converted into an analog signal. Each digital word makes contacts 30 or 36 close or keep them open depending on "ones" and "zeros" it consists of. The effected analog parameter is output current $I_O$ 38. As it can be seen from FIGS. 3 and 4, the bias current can be expressed as:

$$I_{bias}=\frac{VCC-V_{gs}}{R_b}$$

where $V_{gs}$ is a gate-to-source voltage.

An output current $I_O$ is a function of $I_{bias}$. Any change in the magnitude of the working voltage causes a variation in $I_{bias}$, and in $I_O$ accordingly. This leads to a variation in the working voltage and consequently in the volume of sound produced.

It is therefore an object of the present invention to provide a digital/analog sound synthesizing circuit that does not have the shortcomings of the prior art circuits.

It is another object of the present invention to provide a digital/analog sound synthesizing circuit that is not dependent on the voltage source of the circuit.

It is a further object of the present invention to provide a digital/analog sound synthesizing circuit capable of producing a stable reference voltage as the voltage source of the circuit.

It is another further object of the present invention to provide a digital/analog sound synthesizing circuit that is capable of producing a stable reference voltage such that the RC oscillator and the digital/analog bias circuit are supplied with a stable working voltage.

It is yet another further object of the present invention to provide a digital/analog sound synthesizing circuit that is capable of producing a stable reference voltage as a working voltage in the range between 2.4~5.5 V.

It is still another further object of the present invention to provide a digital/analog sound synthesizing circuit that utilizes a stable reference voltage as a working voltage such that the sound frequency and volume produced by the circuit is not dependent on the voltage of the battery source.

SUMMARY OF THE INVENTION

The present invention provides a circuit in which despite any variation in the voltage supply, i.e., between 2.4~5.5 V, a stable reference voltage is produced such that a stable working voltage is supplied to the RC oscillator and the digital/analog bias circuit. The sound synthesizing circuit therefore is capable of producing a stable sound output and eliminates any variations in the sound frequency and the sound volume due to the deterioration in the battery voltage source.

According to the present invention, a digital/analog sound synthesizing circuit comprises an RC oscillator for supplying a system basic oscillating frequency, a timing generator to transform said basic oscillating frequency into clock signals, a sound synthesizer fed by said clock signals to synthesize sound by outputting sound numerical code data, a digital/analog converter for converting said sound numerical code data into analog signals in order to drive a speaker, and a stabilized voltage generator for producing a stabilized reference voltage source to control said RC oscillator and said digital/analog converter.

The stabilized voltage generator circuit of the present invention utilizes a band-gap reference circuit to produce a reference base voltage $V_b$, a voltage source of 2 $V_b$ is then produced by a charge pumping circuit. The voltage source of 2 $V_b$ is then sent to an RC oscillator as the voltage source to obtain a stable oscillating frequency. The 2 $V_b$ voltage source is also sent to the digital/analog circuit such that a stable current of $I_{bias}$ is obtained.

A sound synthesizing circuit is used to synthesize speech, melody, sound effects or other combination of sound. The digital/analog converter of the synthesizing circuit according to the present invention comprises NMOS transistors. In another embodiment, the digital/analog converter comprises PMOS transistors.

BRIEF DESCRIPTION OF THE DRAWINGS

Other object, features and advantages of the present invention will become apparent upon consideration of the specification and the appended drawings, in which.

DETAILED DESCRIPTION OF THE PREFERRED EMBODIMENT

The present invention discloses an apparatus for supplying a stable current for a digital/analog sound synthesizing circuit such that a stabilized working voltage is sent to the RC oscillator and the digital/analog bias circuit as a stable working voltage and eliminating variations in the sound frequency and the sound volume caused by a deterioration in the battery voltage power.

It has been determined that in spite of the variations in the voltage supply in a certain application, as long as a stabilized reference voltage can be generated such that the RC oscillator and the digital/analog bias circuit are supplied with a stabilized working voltage, the sound synthesizing circuit can be operated in a working voltage range between 2.4~5.5 V to produce a stabilized sound effect. The usual defects caused by the variation in the working voltage or the variation in the battery power can be eliminated.

Figure 5:
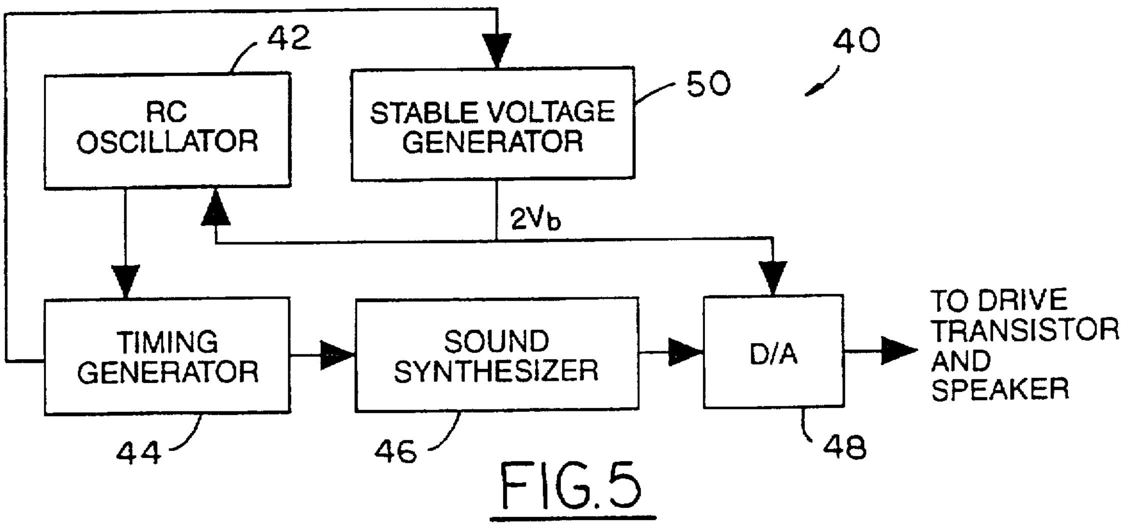
FIG. 5 is a block diagram showing the present invention sound synthesizing circuit.
Figure 6:
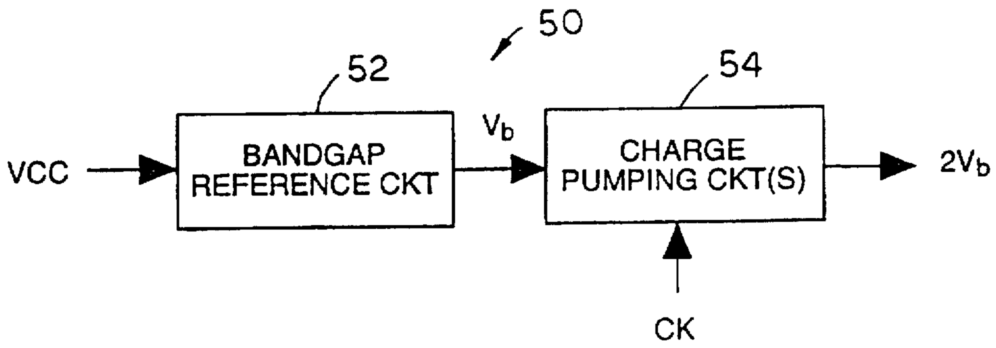
FIG. 6 is a block diagram showing the present invention stable voltage generator.

Referring now to FIG. 5 where a block diagram of the present invention stabilized sound synthesizing circuit 40 is shown. The circuit comprises an RC oscillator 42, a timing generator 44, a sound synthesizer 46, a digital/analog converter 48, and a stabilized voltage generator 50. The stabilized voltage generator 50 is shown in more detail in FIG. 6. The stabilized voltage generator 50 is composed of a band-gap reference circuit 52 and a charge pumping circuit 54.

Band-gap voltage reference circuit is known to use the forward-biased base-emitter junction characteristics. It combines them with carefully adjusted ratio of the resistors employed in the circuit. Thus, positive and negative temperature coefficients of the circuit elements are mutually balanced, and the output voltage exhibits a zero temperature coefficient.

Charge pumping circuit 54 doubles the voltage output by band-gap voltage circuit 52 and delivers the stabilized voltage to RC oscillator 42 and digital-to-analog conversion circuit 48.

A reference base voltage $V_b$ is generated by the band-gap reference circuit 52 to trigger the charge pumping circuit 54 in order to produce a voltage of 2 $V_b$. The voltage 2 $V_b$ is sent to the RC oscillator 42 as the voltage source for the oscillator in order to obtain a stabilized oscillating frequency.

Figure 1:
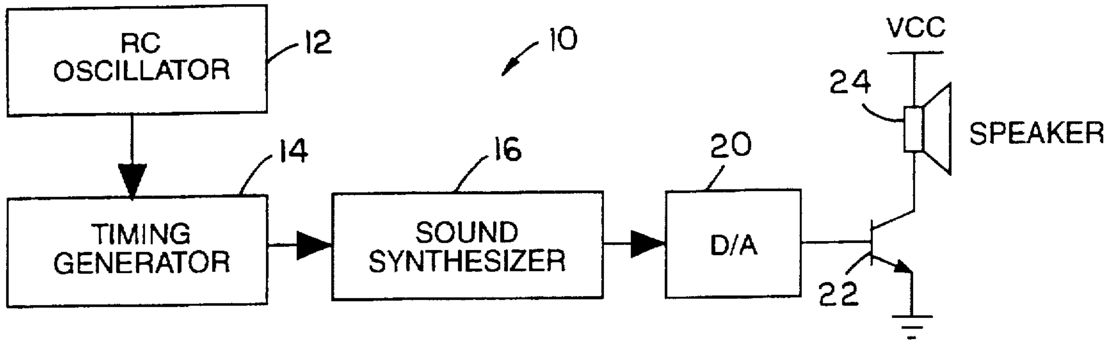
(PRIOR ART) FIG. 1
FIG. 1 is a block diagram illustrating a prior art sound synthesizing circuit.
Figure 2:
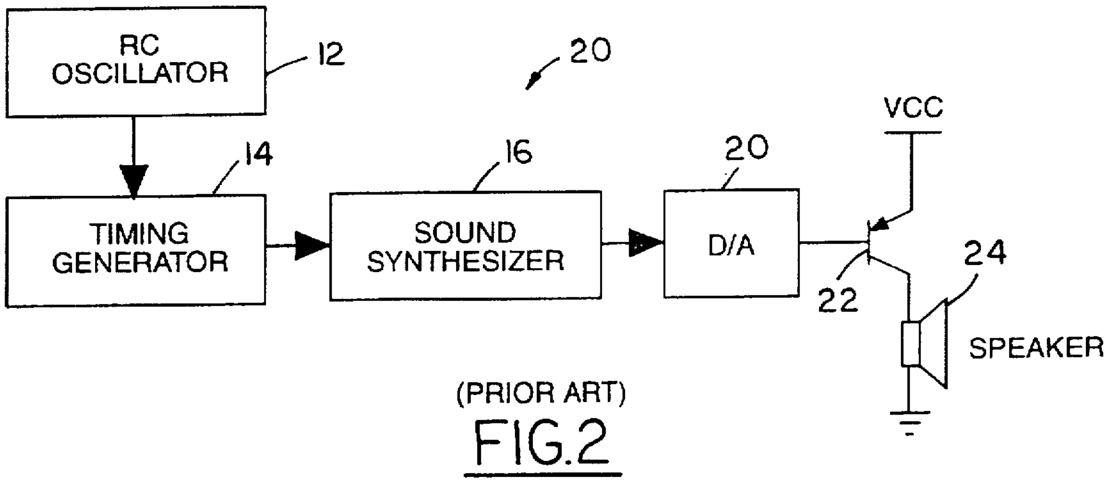
(PRIOR ART) FIG. 2
FIG. 2 is a block diagram showing another prior art sound synthesizing circuit.
Figure 3:
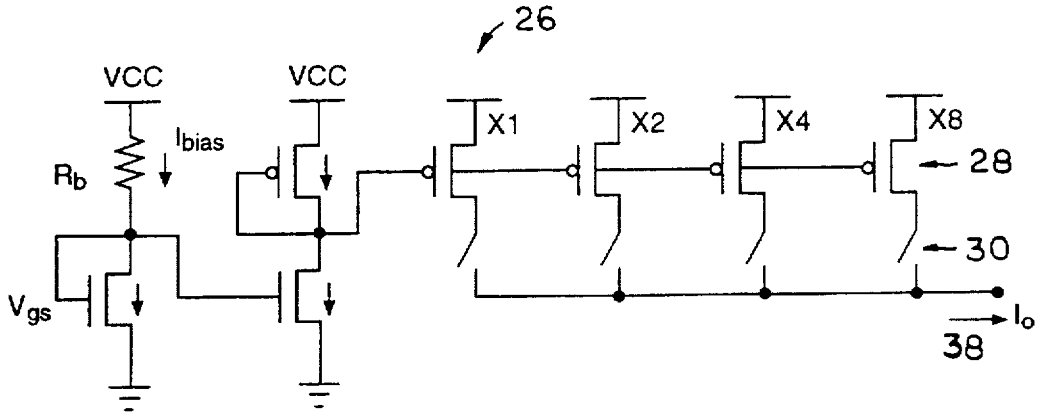
(PRIOR ART) FIG. 3
FIG. 3 is a circuit diagram showing a prior art digital/analog conversion circuit.
Figure 4:
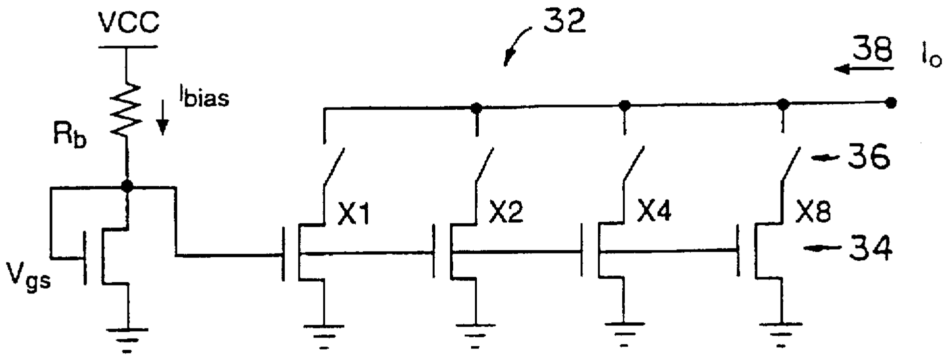
(PRIOR ART) FIG. 4
FIG. 4 is a circuit diagram showing another prior art digital/analog conversion circuit.
Figure 7:
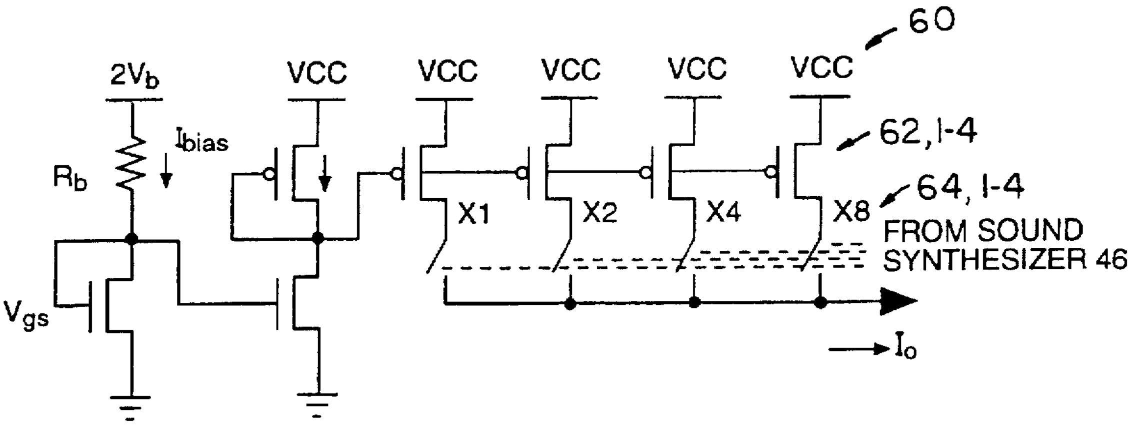
FIG. 7 is a circuit diagram showing the present invention stable voltage digital/analog conversion circuit.
Figure 8:
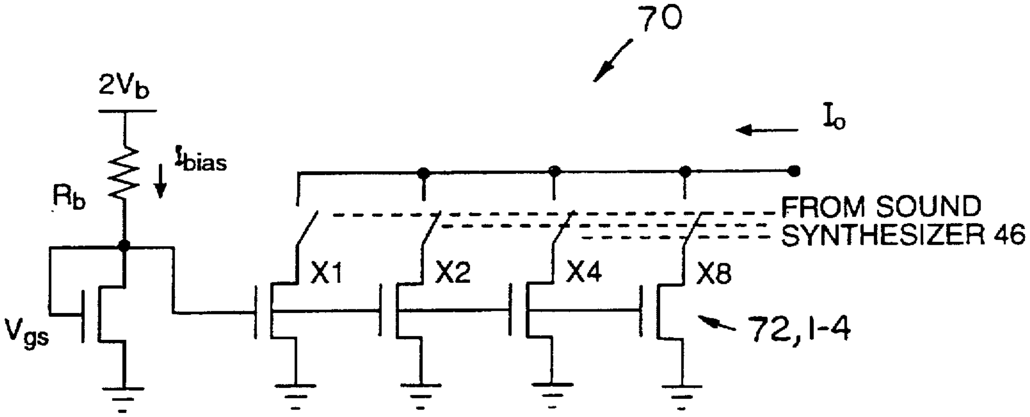
FIG. 8 is a circuit diagram showing another variation of the present invention digital/analog conversion circuit.

The stabilized voltage 2 $V_b$ is also sent to a digital/analog converters 60 and 70 as shown in FIGS. 7 and 8, respectively. The output circuit of FIGS. 7 and 8 is similar to that shown in FIGS. 1 and 2. It is known that, $$I_{bias} = \frac{2V_b - V_{gs}}{R_b}$$

where 2 $V_b$ is the bias voltage, $V_{gs}$ is the voltage of gate to source. Since 2 $V_b$ and $V_{g}$, are stabilized, the resulting $I_{bias}$ is also stabilized. The stabilized voltage 2 $V_b$ produced by the stabilized voltage generator therefore controls the RC oscillator and the digital/analog converter.

Digital-to-analog conversion circuit 60 shown in FIG. 7 is fed by the stabilized voltage 2 $V_b$. The circuit comprises PMOS transistors $\mathbf{62}_{1-4}$ corresponding to respective bits of digital words coming from sound synthesizer 46. Operating specific contacts $\mathbf{64}_{1-4}$, and thus connecting the specific PMOS transistors $\mathbf{62}_{1-4}$ to the output, depends on the presence of "ones" in respective bits of digital words. The value of output current $I_O$ relies on number of transistors $\mathbf{62}_{1-4}$ connected to the output and hence is a function of a "content" of digital words brought from the sound synthesizer.

Digital-to-analog conversion circuit 70 shown in FIG. 8 differs from that in FIG. 7 by the use of NMOS transistors $\mathbf{72}_{1-4}$.

In a described way, a sound synthesizing circuit capable of producing a stabilized volume and sound quality can be achieved. The shortcomings of the prior art circuits of poor quality in sound volume and sound quality due to variation in the voltage source are therefore eliminated.

EXAMPLE

In a common consumer-use electronics utilizing a voltage range between 2.4~5.5 V, assuming $V_b$=1.2V, then 2 $V_b$=2.4 V the working voltage of the RC oscillator is 2.4 V, for the digital/analog converter, $$I_{bias} = \frac{2.4 - V_{gs}}{R_b} = \text{constant}$$

A stabilized sound quality and sound volume from a sound synthesizer is therefore obtained in a system of a working voltage range between 2.4 V~5.5 V.

The reference voltage source from the present invention stabilized voltage generator is only used to trigger the RC oscillator and the digital/analog conversion circuit. It therefore operates only at a light load which further enhances the stabilizing effect of the circuit.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, other similar arrangements of circuit for the stabilized voltage generator can substitute that shown in the preferred embodiment while accomplishing substantially the same desirable result.

The embodiments of the invention in which an exclusive property or privilege is claimed are defined as follows:

1. A battery-fed digital sound synthesizing circuit capable of producing a volume of sound, said sound synthesizing circuit comprising:

an RC oscillator for supplying a timing generator basic oscillating frequency, the timing generator to transform said basic oscillating frequency into clock signals, a sound synthesizer fed by said clock signals to synthesize sound by outputting sound numerical code data, a digital/analog converter for converting said sound numerical code data into analog signals in order to drive a speaker outputting said sound volume, and means for maintaining said basic oscillating frequency substantially constant and speed of playing back said sound volume substantially independent upon changes of voltage of said battery beyond a predetermined voltage range wherein said maintaining means includes a stabilized voltage generator for producing a stabilized reference voltage source to control said RC oscillator and said digital/analog converter, said stabilized voltage generator comprising a band-gap reference circuit connected to a charge pumping circuit.

2. A sound synthesizing circuit according to claim 1, wherein said sound synthesizer is used to synthesize speech, melody, sound effect or other combination of sound.

3. A sound synthesizing circuit according to claim 1, wherein said digital/analog converter comprises NMOS transistors.

4. A sound synthesizing circuit according to claim 1, wherein said digital/analog converter comprises PMOS transistors.

* * * * *